US007471028B2

(12) United States Patent
Onozawa

(10) Patent No.: US 7,471,028 B2
(45) Date of Patent: Dec. 30, 2008

(54) LIQUID EJECTION HEAD AND IMAGE FORMING APPARATUS

(75) Inventor: Sho Onozawa, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/806,024

(22) Filed: May 29, 2007

(65) Prior Publication Data

US 2007/0285473 A1 Dec. 13, 2007

(30) Foreign Application Priority Data

Jun. 7, 2006 (JP) ............................ 2006-158964

(51) Int. Cl.
*H01L 41/00* (2006.01)
*B41J 2/045* (2006.01)

(52) U.S. Cl. ....................... 310/313 R; 347/46; 347/47; 347/68; 310/348

(58) Field of Classification Search ....................... None
See application file for complete search history.

(56) References Cited

U.S. PATENT DOCUMENTS

| | | | | |
|---|---|---|---|---|
| 5,142,307 | A * | 8/1992 | Elrod et al. | 347/46 |
| 2005/0277839 | A1 * | 12/2005 | Alderman et al. | 600/504 |

FOREIGN PATENT DOCUMENTS

| | | | |
|---|---|---|---|
| JP | 9-267473 | A | 10/1997 |
| JP | 2000-62161 | A | 2/2000 |

* cited by examiner

*Primary Examiner*—J. San Martin
*Assistant Examiner*—Bryan P. Gordon
(74) *Attorney, Agent, or Firm*—Birch, Stewart, Kolasch & Birch, LLP

(57) ABSTRACT

The liquid ejection head has: a surface acoustic wave propagation body in which a surface acoustic wave propagates; a nozzle orifice formed in the surface acoustic wave propagation body; a surface acoustic wave generation device which is provided on the surface acoustic wave propagation body around the nozzle orifice and excites the surface acoustic wave propagation body so that a surface acoustic wave is generated in the surface acoustic wave propagation body; a liquid supply device which supplies liquid to the nozzle orifice; and a guide member which is provided in a center of the nozzle orifice and has a tapered conical surface shape section that projects from an ejection surface of the nozzle orifice in an ejection direction, the liquid forming a curved liquid surface in the nozzle orifice in accordance with the tapered conical surface shape section due to surface tension, wherein the surface acoustic wave generates a capillary wave which propagates through the curved liquid surface in the nozzle orifice and which ejects the liquid from an apex section of the tapered conical surface shape section.

10 Claims, 11 Drawing Sheets

36
18A
12
40
18
24
18C
22

32

18B

18B

34

LIQUID EJECTION HEAD AND IMAGE FORMING APPARATUS

BACKGROUND OF THE INVENTION

1. Field of the Invention

The present invention relates to a liquid ejection head and an image forming apparatus, and more particularly, to a liquid ejection head which generates a minute liquid droplet from a liquid surface by means of a surface acoustic wave, and to an image forming apparatus which uses such a liquid ejection head.

2. Description of the Related Art

In the related art, Japanese Patent Application Publication No. 2000-62161 and Japanese Patent Application Publication No. 9-267473 disclose inkjet heads based on a method which ejects ink by emitting a surface acoustic wave (SAW) into ink. In a general surface acoustic wave type of head of this kind, when a surface acoustic wave (SAW, Rayleigh wave) is caused on the surface of a solid and this wave is introduced into a liquid by leaking, then either a group of minute liquid droplets are drawn off from the vicinity of the three-phase interface by a longitudinal wave radiating in a direction forming an angle (Rayleigh angle) with respect to the normal of the incident axis, or alternatively, a group of minute liquid droplets is ejected on the basis of a mechanism in which a capillary wave is indirectly caused in the liquid by means of the radiation of the aforementioned longitudinal wave, this capillary wave is amplified, and the liquid particles are formed from the wave crests when the capillary wave reaches a certain amplitude (formation of a so-called "capillary mist").

However, in the former case (where a group of minute liquid droplets are drawn off from the vicinity of the three-phase interface), there is difficulty in controlling the ejection direction, and there is also variation in the diameter of the particles. On the other hand, the latter case (based on the formation of a so-called capillary mist) uses a mechanism which amplifies the capillary wave on the liquid surface by parametric resonance, and therefore it is not suitable for high-viscosity liquids. Moreover, there is an inherent and fundamental restriction in that, when energy satisfying the resonance conditions is applied continuously for a prescribed period of time, then a phase transition occurs due to viscous heat generation before the amplitude increases to a level at which particles are generated.

SUMMARY OF THE INVENTION

The present invention has been contrived in view of the foregoing circumstances, an object thereof being to provide a liquid ejection head and an image forming apparatus using same, whereby the control of the ejection direction and the ejection volume are improved, and viscous heat generation due to prolonged oscillation of a capillary wave can be prevented.

In order to attain the aforementioned object, the present invention is directed to a liquid ejection head, comprising: a surface acoustic wave propagation body in which a surface acoustic wave propagates; a nozzle orifice formed in the surface acoustic wave propagation body; a surface acoustic wave generation device which is provided on the surface acoustic wave propagation body around the nozzle orifice and excites the surface acoustic wave propagation body so that a surface acoustic wave is generated in the surface acoustic wave propagation body; a liquid supply device which supplies liquid to the nozzle orifice; and a guide member which is provided in a center of the nozzle orifice and has a tapered conical surface shape section that projects from an ejection surface of the nozzle orifice in an ejection direction, the liquid forming a curved liquid surface in the nozzle orifice in accordance with the tapered conical surface shape section due to surface tension, wherein the surface acoustic wave generates a capillary wave which propagates through the curved liquid surface in the nozzle orifice and which ejects the liquid from an apex section of the tapered conical surface shape section.

In this aspect of the present invention, a surface acoustic wave (SAW) generated by the surface acoustic wave generation device propagates through the surface acoustic wave propagation body towards the nozzle orifice, and it is radiated from the edge faces of the nozzle orifice into the liquid inside the nozzle. By means of this leaky SAW, a capillary wave (surface tension wave) is generated in the liquid surface in the nozzle, and this capillary wave propagates through the liquid surface towards the center of the nozzle. In this aspect of the present invention, the guide member having a conical surface shape section is disposed in a state where it projects from the nozzle orifice in the center of the nozzle, and therefore a liquid surface which is curved in accordance with the conical surface shape section of the guide member (a curved liquid surface) is formed in the nozzle due to the surface tension of the liquid. Consequently, the capillary wave caused indirectly by the leaky SAW propagates through the curved surface and is concentrated at the apex section of the guide member. In this way, the liquid concentrated at the apex section of the guide member separates from the liquid surface and forms a particle, which is ejected as a liquid droplet.

In this way, by forming a curved liquid surface by means of the surface tension of the liquid, in accordance with the conical surface shape section of the guide member, the capillary wave becomes able to propagate more readily in the direction of the longitudinal wave radiation angle (Rayleigh angle) on the basis of the leaky Rayleigh wave. Furthermore, since the apex section of the guide member forms the interface (triple point) between the three layers of the solid (the guide member), the liquid, and the gas (the air) (in other words, since the three-layer interface is formed into a singular point at the front tip of the guide member), then control over the ejection direction and the ejection volume is improved in comparison with the related art composition (namely, a composition in which no guide member is provided).

Moreover, in this aspect of the present invention, a particle formation mechanism based on amplification of a capillary wave, as used in the related art, is not used; therefore, it is possible to avoid viscous loading due to prolonged oscillation of a highly viscous liquid and to avoid the phase transition caused by same.

Preferably, the surface acoustic wave generation device has interdigital transducers.

For the surface acoustic wave generation device, for example, it is possible to provide comb tooth-shaped electrodes (comb electrodes) in an alternating, staggered intermeshing arrangement, on top of the surface acoustic wave propagation body made of a piezoelectric material.

Preferably, the liquid supply device is a liquid reservoir located across the surface acoustic wave propagation body from a surface of the surface acoustic wave propagation body through which the surface acoustic wave propagates.

In this aspect of the present invention, the liquid reservoir is disposed on the rear surface side of the surface acoustic wave propagation body (on the opposite side to the ejection surface), and the liquid is supplied to the nozzle from this liquid reservoir.

Preferably, the surface acoustic wave propagation body has a plurality of polarized cut substrates of piezoelectric material which are provided in form of a mosaic around the nozzle orifice.

If a material having strong anisotropy in terms of the propagation speed of the surface acoustic wave is used, for example, then desirably, the direction having the best propagation speed is adjusted to correspond to the direction toward the center of the nozzle orifice, and a surface acoustic propagation body is formed by arranging and attaching polarized cut substrates of piezoelectric material, in the form of a mosaic, about the perimeter of the nozzle orifice.

Preferably, the surface acoustic wave generation device has interdigital transducers each of which has a partial circular arc shape and which are formed on the plurality of polarized cut substrates.

In this aspect of the present invention, it is possible to achieve an electrode arrangement having rotational symmetry about the perimeter of the nozzle orifice, by means of the comb-shaped interdigital electrodes (IDTs: interdigital transducers) on the plurality of cut substrates of piezoelectric material which are combined in the form of a mosaic about the perimeter of the nozzle orifice.

Preferably, the guide member is composed of a hydrophilic material.

With a view to causing the liquid to wet and spread over the conical surface shape section of the guide member and forming a curved liquid surface in a state where it projects from the nozzle orifice, it is desirable that the surface of the guide member should have hydrophilic properties.

In order to attain the aforementioned object, the present invention is also directed to an image forming apparatus comprising any one of the liquid ejection heads described above, wherein a droplet of the liquid is ejected from the apex section of the guide member toward a recording medium so that an image is formed on the recording medium.

The driving of the surface acoustic wave generation device is controlled on the basis of the input image data, and liquid droplets are ejected from the apex section of the guide member accordingly. The liquid droplets thus ejected are deposited onto a recording medium, thereby forming dots. By controlling the ejection timing and the ejection volume of the liquid droplets in accordance with the image data, it is possible to record a desired image (dot arrangement) on the recording medium.

Compositional examples of liquid ejection head include a full line type of ejection head having a nozzle row in which a plurality of nozzles are arranged through a length corresponding to the full width of the recording medium.

In this case, a mode may be adopted in which a plurality of relatively short ejection head modules having nozzles rows which do not reach a length corresponding to the full width of the ejection receiving medium are combined and joined together, thereby forming ejection intersection point rows of a length that correspond to the full width of the recording medium.

A full line type liquid ejection head is usually disposed in a direction that is perpendicular to the relative feed direction (relative conveyance direction) of the recording medium, but a mode may also be adopted in which the liquid ejection head is disposed following a prescribed oblique direction that forms a prescribed angle with respect to the direction perpendicular to the conveyance direction.

Here, "recording medium" is a medium which receives the deposition of liquid ejected from a nozzle, and in an image forming apparatus, it corresponds to a medium such as recording paper, or an intermediate transfer body. More specifically, the "recording medium" may be called a print medium, image forming medium, image receiving medium, ejection receiving medium, or the like. This term includes various types of media, irrespective of material and size, such as continuous paper, cut paper, sealed paper, resin sheets such as OHP sheets, film, cloth, a printed circuit board on which a wiring pattern, or the like, is formed, and an intermediate transfer medium, and the like.

Modes of the movement device for causing the recording medium and the liquid ejection head to move relatively to each other may include a mode where the recording medium is conveyed with respect to the stationary (fixed) head, a mode where the head is moved with respect to the stationary recording medium, and a mode where both the head and the recording medium are moved.

According to the present invention, a capillary wave propagates in accordance with the conical surface shape section of the guide member and a liquid particle is generated from the apex section of the conical surface shape section of the guide member, and therefore the control over the ejection direction and the ejection volume is improved. Moreover, by means of the particle forming mechanism according to the present invention, it is possible to avoid the problem of viscous heat generation in the highly viscous liquid and the problem of phase transition caused by such heat generation, as in the related art.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

Figure 1:
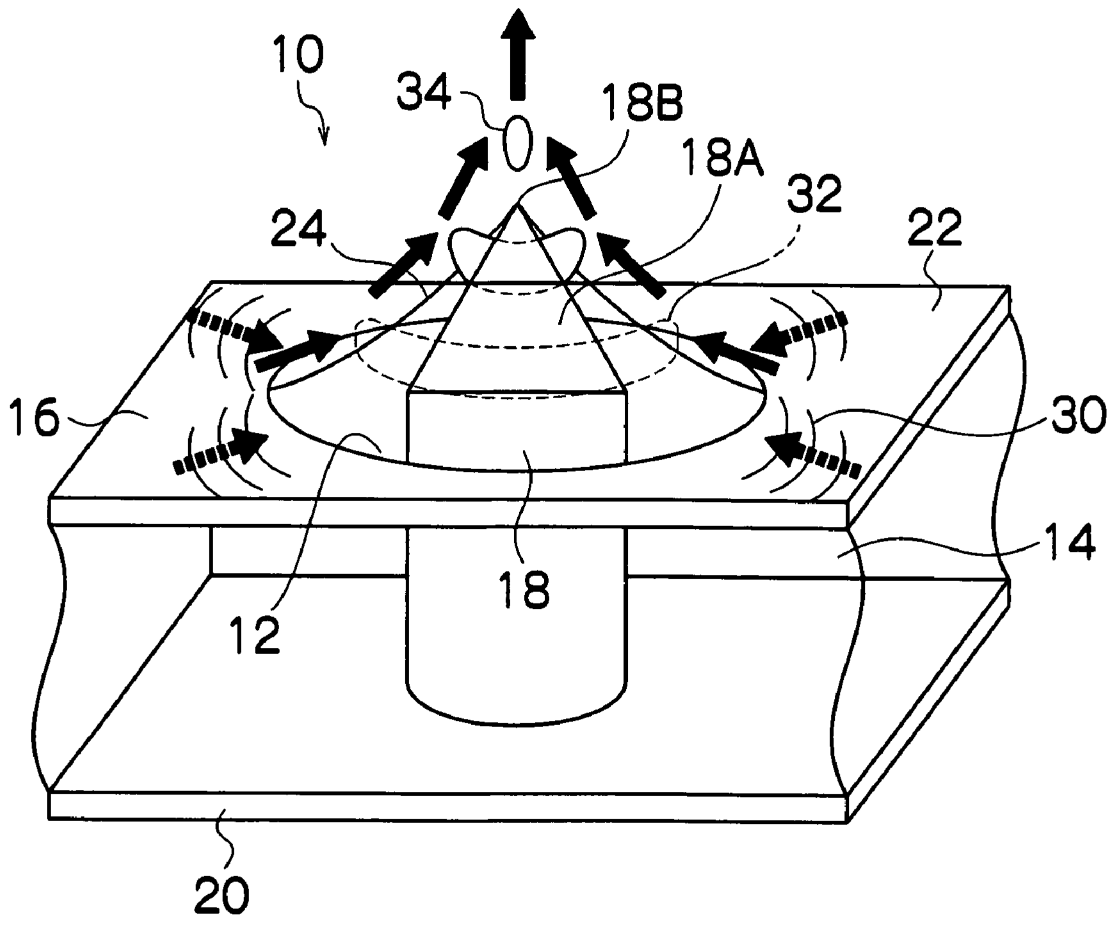
FIG. 1 is an oblique perspective diagram illustrating the composition of a liquid ejection head relating to an embodiment of the present invention.

FIG. 1 is a perspective diagram illustrating the composition of a liquid ejection head in an embodiment of the present invention. In the liquid ejection head 10 shown in FIG. 1, the reference numeral 12 denotes a nozzle orifice, the reference numeral 14 denotes an ink pool (corresponding to a "liquid reservoir"), the reference numeral 16 denotes a surface acoustic wave generating substrate (corresponding to a "surface acoustic wave propagation medium"), and the reference numeral 18 denotes a guide member which defines the shape of the liquid surface inside the nozzle. FIG. 1 illustrates the liquid droplet ejection element for one channel corresponding to one nozzle orifice 12; however, when applied to an inkjet head (a "print head" or a "recording head"), or the like, a structure comprising a plurality of channels arranged one-dimensionally (in a column shape) or two-dimensionally (in a plane shape) is adopted.

The nozzle orifice 12 is formed in the surface acoustic wave generating substrate 16, the ink pool 14 is formed in the space between the surface acoustic wave generating substrate 16 and an ink pool substrate 20 disposed opposing the surface acoustic wave generating substrate 16, and ink liquid is filled into the ink pool 14.

The guide member 18 is a rod-shaped member of which the front end section 18A has a circular conical shape, and which is erected on the ink pool substrate 20 in a state where the central axis coincides with the center of the nozzle orifice 12. The front end section 18A of the guide member 18 projects beyond the ejection surface (nozzle surface) 22 of the nozzle orifice 12 in the ink ejection direction (the upward direction in the diagram), and due to the surface tension of the ink liquid, a liquid surface 24 is formed curving along the oblique surface of the circular conical shape of the front end section 18A (namely, a conical surface having a tapering shape in which the cross-sectional area gradually decreases towards the front end).

From the viewpoint of forming an ink liquid surface following the shape of the front end section 18A of the guide member 18 which projects beyond the nozzle orifice 12 as described above, it is desirable to use a hydrophilic material for the guide member 18 (for instance, a porous material, or the like).

Figure 2:
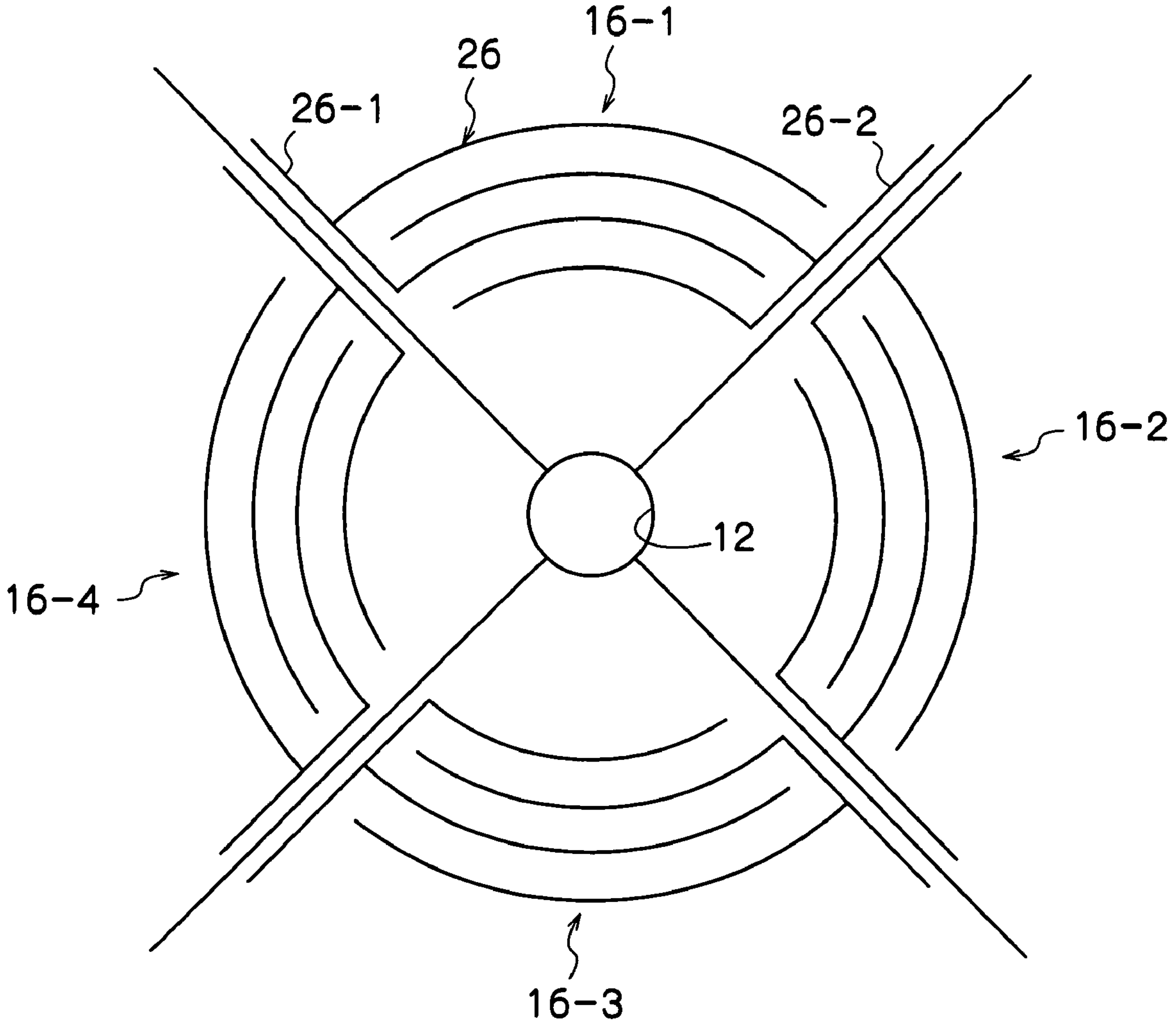
FIG. 2 is a plan diagram illustrating one example of interdigital transducers (IDTs) formed on a surface acoustic wave generating substrate.

The surface acoustic wave generation substrate 16 is constituted by a piezoelectric material, and as shown in FIG. 2, comb-shaped interdigital electrodes 26, each in the form of a circular arc, are provided around the perimeter of the nozzle orifice 12, so as to function as interdigital transducers (IDT). For the substrate material, it is possible to use a piezoelectric material, such as $Li_2NbO_3$, $Li_2TaO_7$, $Li_2B_4O_7$, ZnO, AlN, or the like. These piezoelectric materials may be formed by deposition onto a sapphire or a heat resistance hard glass such as Pyrex glass™.

The surface acoustic wave generating substrate 16 according to the present example is constituted by polarized cut substrates 16-1, 16-2, 16-3 and 16-4 obtained by dividing the periphery of the nozzle orifice 12 into four equal parts (in the present case, the periphery of the nozzle orifice 12 is divided equally so that each polarized cut substrate corresponds to 90°), the substrates 16-1, 16-2, 16-3 and 16-4 being attached in the form of a mosaic. The comb-shaped interdigital electrodes 26 in the form of partial arcs (substantially, a quarter-circle arc) are formed on the surfaces of the cut substrates 16-1, 16-2, 16-3 and 16-4.

The comb-shaped interdigital electrodes 26 are disposed in a state where the pattern of a comb-shaped first electrode 26-1 and the pattern of a comb-shaped second electrode 26-2 are arranged in a staggered intermeshing fashion. There are no particular restrictions on the method of forming the above-described comb-shaped electrode patterns on the substrate, and it is possible to use a commonly known electrode forming method, such as a deposition method, an etching method, an ion injection method, a thermal diffusion method, or the like. Moreover, it is also possible to form grooves in the surface of the substrate, and to form electrode patterns by filling (or depositing) conductive material into these grooves.

As shown in the example in FIG. 2, a composition in which polarized cut substrates are attached in the form of a mosaic has beneficial effects in that it is possible to use a material having strong anisotropy in respect of the speed of propagation, and in that it is possible to combine cut substrates in such a manner that the direction in which a wave propagates most readily is directed toward the center of the nozzle orifice 12.

In FIG. 2, a composition is shown in which the substrates are divided in four about the perimeter of the nozzle, but the number of divisions is not limited to that shown in the diagram. Furthermore, it is also possible to adopt a mode in which the surface acoustic wave generating substrate is constituted by an individual piezoelectric element substrate, or by continuous thin films of piezoelectric material. In this case, it is necessary to polarize the substrates in accordance with the shape of the IDTs.

When an electrical signal (drive signal) of an appropriate frequency and voltage is applied between the first electrode 26-1 and the second electrode 26-2 of the comb-shaped interdigital electrodes 26 shown in FIG. 2, then a surface acoustic wave (reference numeral 30 in FIG. 1) is generated in the surface of the surface acoustic wave generating substrate 16.

The surface acoustic wave 30 generated in this way propagates through the surface of the surface acoustic wave generating substrate 16, toward the center of the nozzle orifice 12. The surface acoustic wave 30 reaches the edge portion of the opening of the nozzle orifice 12, and is then radiated into the ink liquid which lies in contact with the edge portion of the opening. By means of this leaky SAW, a capillary wave 32 is generated in the liquid surface inside the nozzle orifice 12 (see FIG. 1). The ring-shaped capillary wave 32 which is generated indirectly in this way, propagates (moves) toward the center of the nozzle orifice 12, passes through the curved liquid surface 24 corresponding to the shape of the front end section 18A of the guide member 18 and concentrates at the apex section 18B (front tip) of the guide member 18, thereby causing a liquid droplet 34 to separate (in the form of a particle) from the apex section 18B and be ejected. Desirably, only the region of the vicinity of the apex of the guide member 18 is subject to a water repellent treatment (hydrophobic treatment), in such a manner that the ejection liquid can readily be formed into particles.

Figures 3A, 3B, 3C, 3D, 3E, 3F, 3G:
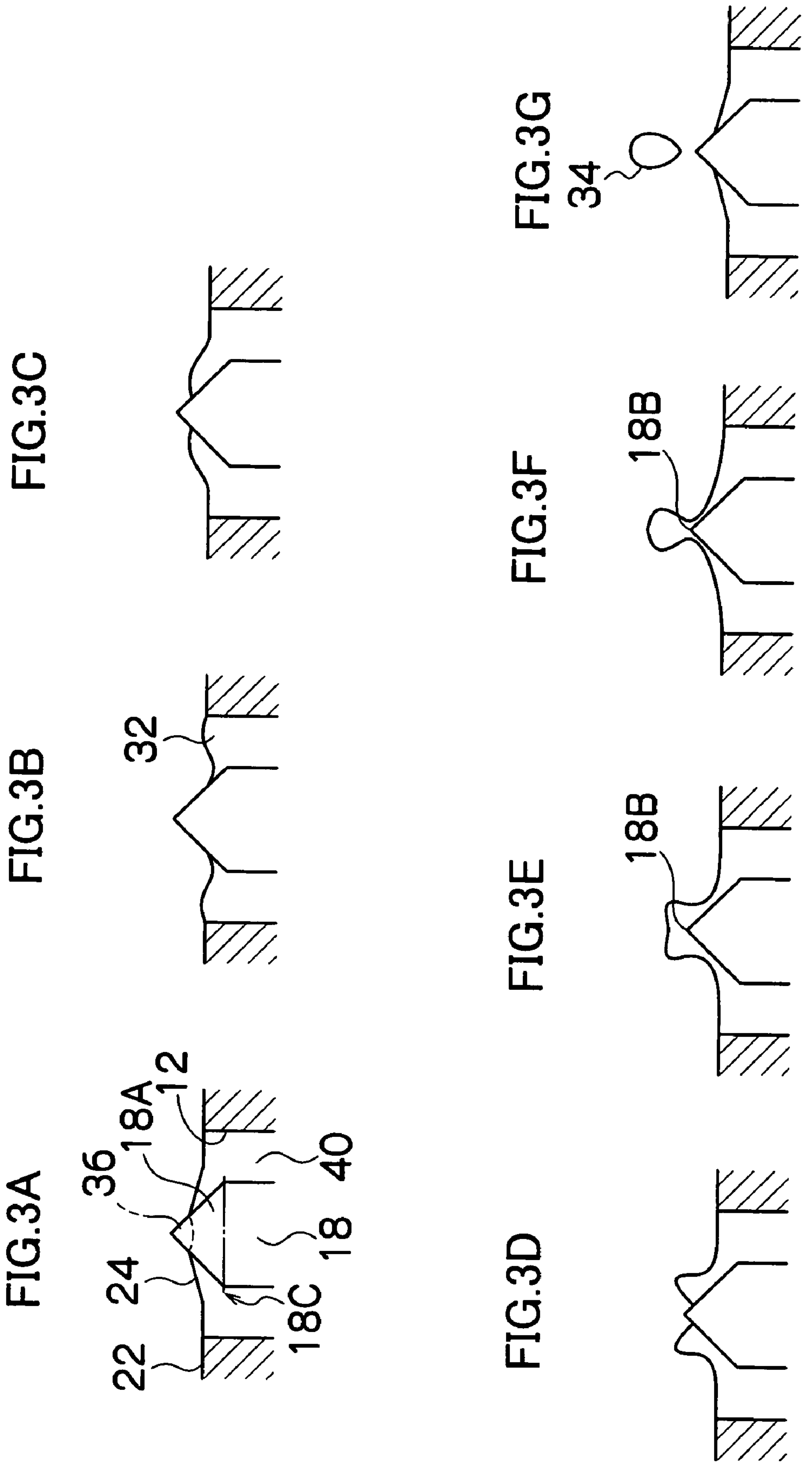
FIGS. 3A to 3G are diagrams illustrating states of propagation of a capillary wave generated in a nozzle by the surface acoustic wave, and the corresponding ejection process.

FIGS. 3A to 3G are diagrams illustrating the state of propagation of the capillary wave caused in the nozzle by the surface acoustic wave, and the corresponding process of ejection. FIG. 3A shows a steady state before ejection driving. As shown in FIG. 3A, in the guide member 18, only the apex of the front end section 18A of the conical shape, and the vicinity of same, (only the apex vicinity region 36 indicated by the dotted line in FIG. 3A) are subject to a hydrophilic treatment. The bottom surface 18C of the conical shape is positioned on the rear side of the nozzle with respect to the ejection surface 22 of the nozzle orifice 12 (in the downward position in FIG. 3A), and due to the surface tension of the ink liquid 40, a curved liquid surface 24 which reflects the shape of the conical surface is formed on the inner side of nozzle orifice 12.

When an ejection drive burst signal is applied between a pair of electrodes of the comb-shaped interdigital electrodes 26 shown in FIG. 2, a surface acoustic wave is radiated from the edge of the nozzle orifice 12 into the ink liquid 40, thereby causing a capillary wave 32 to be generated in the liquid surface inside the nozzle, as shown in FIG. 3B. This capillary wave 32 propagates over the curved liquid surface toward the center of the nozzle orifice 12, in accordance with the conical surface of the guide member 18 (FIGS. 3C to 3D). Ultimately, the capillary wave 32 concentrates at the apex section 18B of the guide member 18, causing ink to separate (in the form of a particle) from the front tip 18B of the guide member 18 and be propelled as a liquid droplet (FIGS. 3E to 3G).

According to the liquid ejection head 10 relating to the present embodiment, the capillary wave 32 propagates along the conical shape of the guide member 18, the liquid forms a particle at the apex section 18B of the guide member 18 so that a liquid droplet 34 is ejected. Consequently, the control of the ejection direction and the volume (ejection quantity) per droplet (particle) is improved. Moreover, by means of the particle forming mechanism according to the present embodiment, it is possible to avoid the excessive viscous heat generation in the highly viscous liquid and phase transition caused by such heat generation, as in the related art.

Consideration of Ejection Volume

Figure 4:
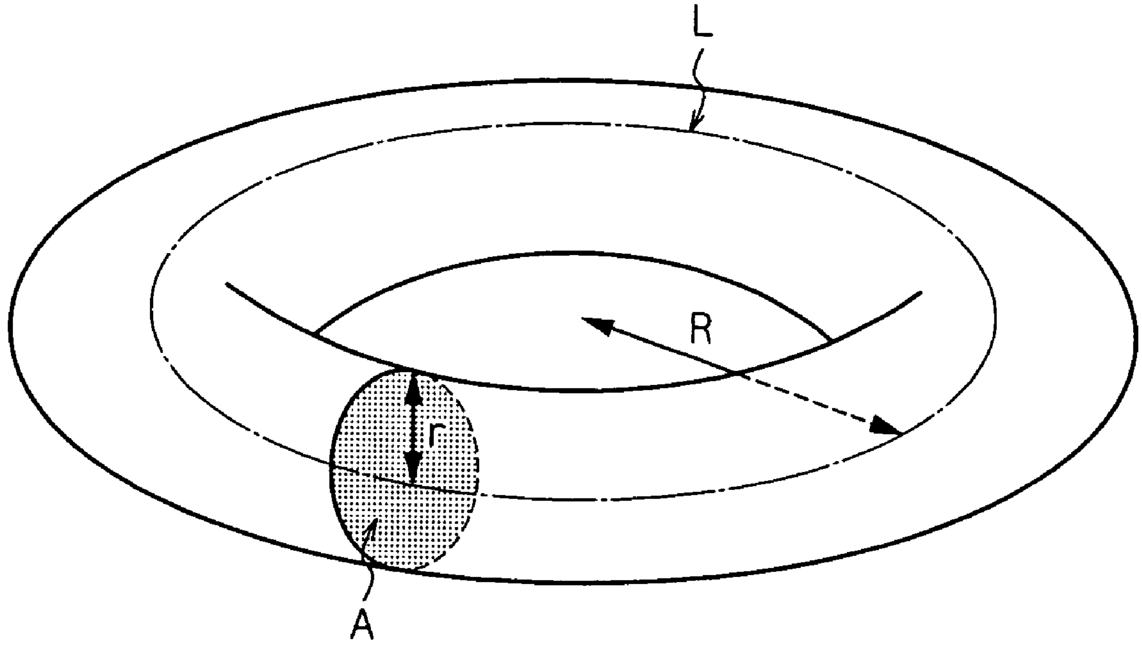
FIG. 4 is a diagram of a torus used for calculating the approximate ejection volume.

Here, the volume of a liquid droplet ejected from the liquid ejection head 10 according to the composition described above is calculated approximately. In the torus shown in FIG. 4, taking r to be the radius of the cross-section and taking R to be the radius of the central line, since the cross-sectional area A satisfies "$A=\pi r^2$" and the circumference of the central line L satisfies "$L=2\pi R$", then the volume V of the torus satisfies $$V=A\times L=2\pi^2r^2R.$$

Here, taking the nozzle diameter to be "$D\approx2(R+r)$", and the wavelength $\lambda$ of the capillary wave generated by the leaky SAW to be "$\lambda\approx4r$", then it is estimated that the amplitude is approximately equal to r. Supposing that a solitary wave is generated due to surface tension as a result of inputting a half-wave of the SAW, then since the volume upon ejection, $V_d$, can be regarded as approximately equal to V/2, then the following equation is satisfied:

$$V_d=(1/64)\pi^2\lambda^2(2D-\lambda).$$

For example, if D=20 (μm) and $\lambda$=10 (μm), then $V_d$ is calculated to be "$V_d\approx0.46$ (pl)".

Consideration of Ejection Speed

Supposing that liquid is ejected at the propagation speed of the capillary wave, the ejection speed $U_d$ is given by: $U_d=\sqrt{(2\pi\gamma/(\rho\lambda))}$. Here, $\gamma$ is the surface tension, $\rho$ is the density, and $\lambda$ is the wavelength of the capillary wave. For example, if "water" is used as the ejection liquid, then supposing that $\gamma$=70 (mN/m), $\rho$=1000 (kg/$m^3$) and $\lambda$=10 (μm), the ejection speed $U_d$ is calculated to be "$U_d\approx6.63$ (m/s)".

In the case of this ejection volume, the initial speed required for deposition over a gap of 1.5 (mm) is approximately 5.36 (m/s), and hence the deposition conditions are satisfied. In order to reduce drifting, and the like, caused by external disturbance, a desirable mode is one in which the flight of the droplets is assisted by, for instance, applying an electric field in the space across which the liquid droplets are propelled and thereby accelerating the charged ink droplets by means of the electric field.

Example of Composition of Image Forming Apparatus

Next, an example of an image forming apparatus which employs the liquid ejection head 10 described above as a print head, will be explained below.

Figure 5:
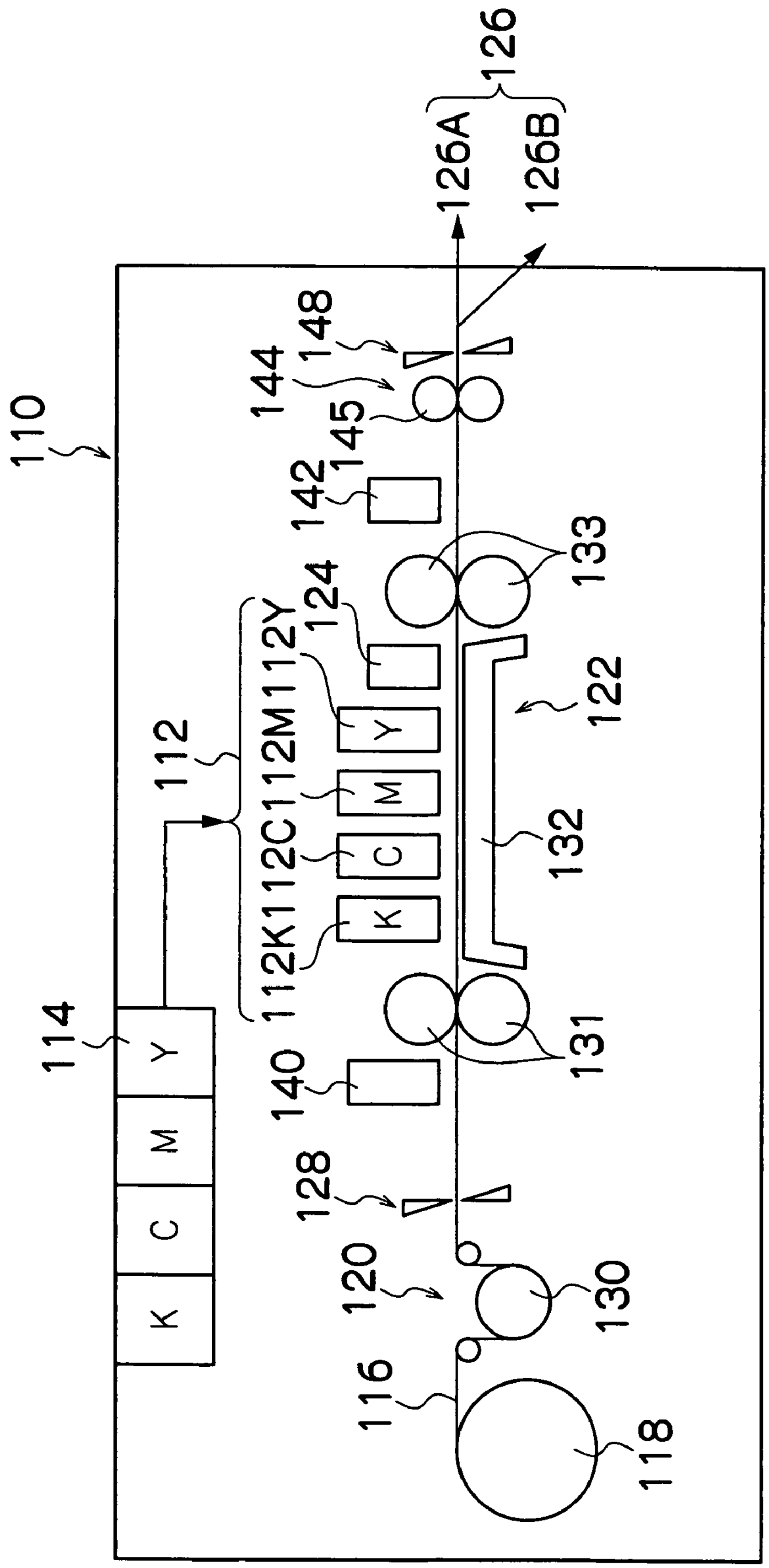
FIG. 5 is a general schematic drawing of an inkjet recording apparatus which forms one embodiment of an image forming apparatus relating to an embodiment of the present invention.

FIG. 5 is a general schematic drawing of an inkjet recording apparatus which forms one embodiment of an image forming apparatus relating to the present invention. As shown in FIG. 5, the inkjet recording apparatus 110 comprises: a print unit 112 having a plurality of recording heads (hereinafter, simply called "heads") 112K, 112C, 112M, and 112Y provided for respective ink colors of black (K), cyan (C), magenta (M), and yellow (Y), respectively; an ink storing and loading unit 114 for storing inks to be supplied to the heads 112K, 112C, 112M and 112Y; a paper supply unit 118 for supplying recording paper 116 forming a recording medium; a decurling unit 120 for removing curl in the recording paper 116; a media conveyance unit 122, disposed facing the nozzle face (ink ejection face) of the print unit 112, for conveying the recording paper 116 while keeping the recording paper 116 flat; a print determination unit 124 for reading the printed result produced by the print unit 112; and a paper output unit 126 for outputting recorded recording paper (printed matter) to the exterior.

The ink storing and loading unit 114 has ink tanks for storing the inks of K, C, M and Y to be supplied to the heads 112K, 112C, 112M, and 112Y, and the tanks are connected to the heads 112K, 112C, 112M, and 112Y by means of prescribed channels. The ink storing and loading unit 114 has a warning device (for example, a display device or an alarm sound generator) for warning when the remaining amount of any ink is low, and has a mechanism for preventing loading errors among the colors.

In FIG. 5, a magazine for rolled paper (continuous paper) is shown as an example of the paper supply unit 118; however, more magazines with paper differences such as paper width and quality may be jointly provided. Moreover, papers may be supplied with cassettes that contain cut papers loaded in layers and that are used jointly or in lieu of the magazine for rolled paper.

In the case of a configuration in which a plurality of types of recording medium (media) can be used, it is preferable that an information recording medium such as a bar code and a wireless tag containing information about the type of media is attached to the magazine, and by reading the information contained in the information recording medium with a predetermined reading device, the type of recording medium to be used (type of medium) is automatically determined, and ink-droplet ejection is controlled so that the ink-droplets are ejected in an appropriate manner in accordance with the type of medium.

The recording paper 116 delivered from the paper supply unit 118 retains curl due to having been loaded in the magazine. In order to remove the curl, heat is applied to the recording paper 116 in the decurling unit 120 by a heating drum 130 in the direction opposite from the curl direction in the magazine. The heating temperature at this time is preferably controlled so that the recording paper 116 has a curl in which the surface on which the print is to be made is slightly round outward.

In the case of the configuration in which roll paper is used, a cutter (first cutter) 128 is provided as shown in FIG. 5, and the continuous paper is cut into a desired size by the cutter 128. When cut papers are used, the cutter 128 is not required.

After decurling, the cut recording paper 116 is nipped and conveyed by the pair of conveyance rollers 131, and is supplied onto the platen 132. A pair of conveyance rollers 133 is also disposed on the downstream side of the platen 132 (the downstream side of the print unit 112), and the recording paper 116 is conveyed at a prescribed speed by the joint action of the front side pair of conveyance rollers 131 and the rear side pair of conveyance rollers 133.

The platen 132 functions as a member (a recording medium holding device) which holds (supports) the recording paper 116 while keeping the recording paper 116 flat, and is a member which functions as a rear surface electrode for forming an electric field for assisting flight. The platen 132 in FIG. 5 has a width dimension which is greater than the width of the recording paper 116, and at least the portion of the platen 132 opposing the nozzle surface of the print unit 112 and the sensor surface of the print determination unit 124 forms a horizontal surface (flat surface).

A heating fan 140 is provided in the conveyance path of the recording paper 116, on the upstream side of the print unit 112. This heating fan 140 blows heated air onto the recording paper 116 before printing, and thereby heats up the recording paper 116. By heating the recording paper 116 before printing, the ink dries more readily after landing on the paper.

Figure 6:
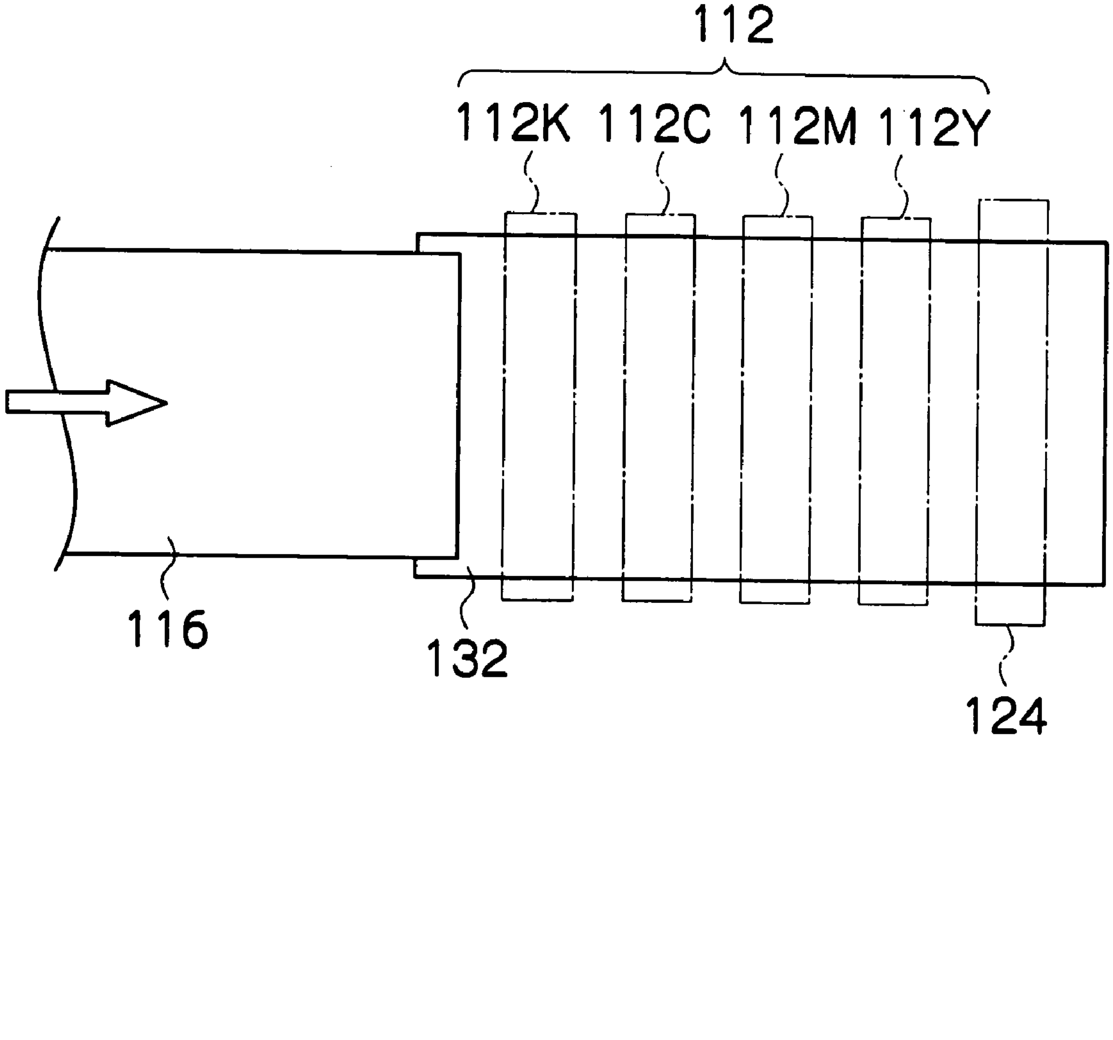
FIG. 6 is a principal plan diagram of the peripheral area of a print unit in the inkjet recording apparatus illustrated in FIG. 5.

The heads 112K, 112C, 112M and 112Y of the printing unit 112 are full line heads having a length corresponding to the maximum width of the recording paper 116 used with the inkjet recording apparatus 110, and comprising a plurality of nozzles for ejecting ink arranged on a nozzle face through a length exceeding at least one edge of the maximum-size recording paper (namely, the full width of the printable range) (see FIG. 6).

The print heads 112K, 112C, 112M and 112Y are arranged in color order (black (K), cyan (C), magenta (M), yellow (Y)) from the upstream side in the feed direction of the recording paper 116, and these respective heads 112K, 112C, 112M and 112Y are fixed extending in a direction substantially perpendicular to the conveyance direction of the recording paper 116.

A color image can be formed on the recording paper 116 by ejecting inks of different colors from the heads 112K, 112C, 112M and 112Y, respectively, onto the recording paper 116 while the recording paper 116 is conveyed by the medium conveyance unit 122.

By adopting a configuration in which the full line heads 112K, 112C, 112M and 112Y having nozzle rows covering the full paper width are provided for the respective colors in this way, it is possible to record an image on the full surface of the recording paper 116 by performing just one operation of relatively moving the recording paper 116 and the printing unit 112 in the paper conveyance direction (the sub-scanning direction), in other words, by means of a single sub-scanning action. Higher-speed printing is thereby made possible and productivity can be improved in comparison with a shuttle (serial) type head configuration in which a recording head reciprocates in the main scanning direction.

Although the configuration with the KCMY four standard colors is described in the present embodiment, combinations of the ink colors and the number of colors are not limited to those. Light inks, dark inks or special color inks can be added as required. For example, a configuration is possible in which heads for ejecting light-colored inks such as light cyan and light magenta are added. Furthermore, there are no particular restrictions of the sequence in which the heads of respective colors are arranged.

The print determination unit 124 illustrated in FIG. 5 has an image sensor (line sensor or area sensor) for capturing an image of the droplet ejection result of the print unit 112, and functions as a device to check for ejection defects such as blockages, landing position displacement, and the like, of the nozzles, on the basis of the image of ejected droplets read in by the image sensor. A test pattern or the target image printed by the print heads 112K, 112C, 112M, and 112Y of the respective colors is read in by the print determination unit 124, and the ejection performed by each head is determined. The ejection determination includes the presence of ejection, measurement of the dot size, measurement of the dot depositing position, and the like.

A post-drying unit 142 is disposed following the print determination unit 124. The post-drying unit 142 is a device to dry the printed image surface, and includes a heating fan, for example.

A heating/pressurizing unit 144 is disposed following the post-drying unit 142. The heating/pressurizing unit 144 is a device to control the glossiness of the image surface, and the image surface is pressed with a pressure roller 145 having a predetermined uneven surface shape while the image surface is heated, and the uneven shape is transferred to the image surface.

The printed matter generated in this manner is outputted from the paper output unit 126. In the inkjet recording apparatus 110, a sorting device (not shown) is provided for switching the outputting pathways in order to sort the printed matter with the target print and the printed matter with the test print, and to send them to paper output units 126A and 126B, respectively. When the target print and the test print are simultaneously formed in parallel on the same large sheet of paper, the test print portion is cut and separated by a cutter (second cutter) 148. Although not shown in FIG. 5, the paper output unit 126A for the target prints is provided with a sorter for collecting prints according to print orders.

Figure 7:
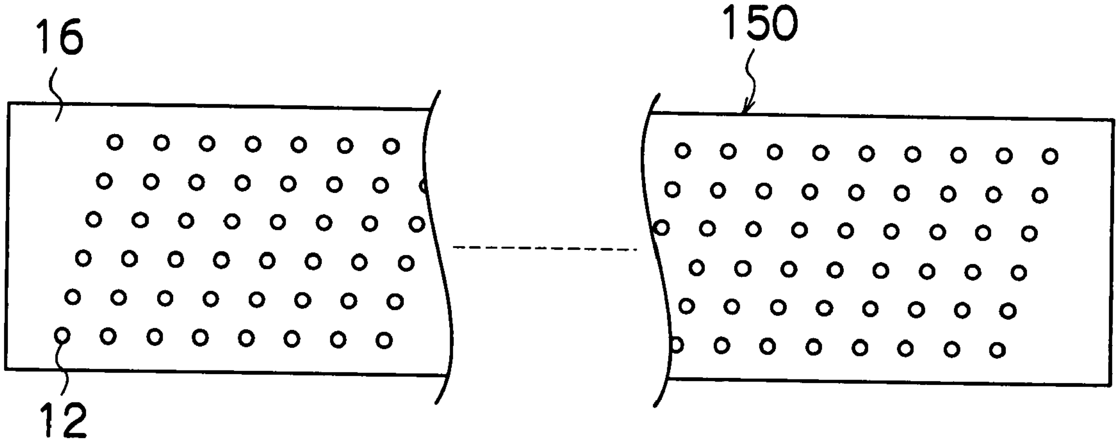
FIG. 7 is a plan diagram of the ejection surface of the head.

FIG. 7 is a plan diagram of the ejection surface of the head. The heads 112K, 112C, 112M and 112Y of the respective ink colors shown in FIG. 5 have the same structure, and a reference numeral 150 is used below to designate a represent example of the heads.

In order to achieve a high density of the dot pitch printed onto the surface of the recording paper 116, it is necessary to achieve a high density of the nozzle pitch in the head 150. As shown in FIG. 7, the head 150 according to the present embodiment has a structure in which nozzle orifices 12, which are ink ejection ports, are arranged (two-dimensionally) in a matrix configuration, thereby achieving a high density of the effective nozzle interval (projected nozzle pitch) obtained when the nozzles are projected to an alignment in the lengthwise direction of the head (a direction perpendicular to the paper feed direction; namely, the main scanning direction).

Figure 8:
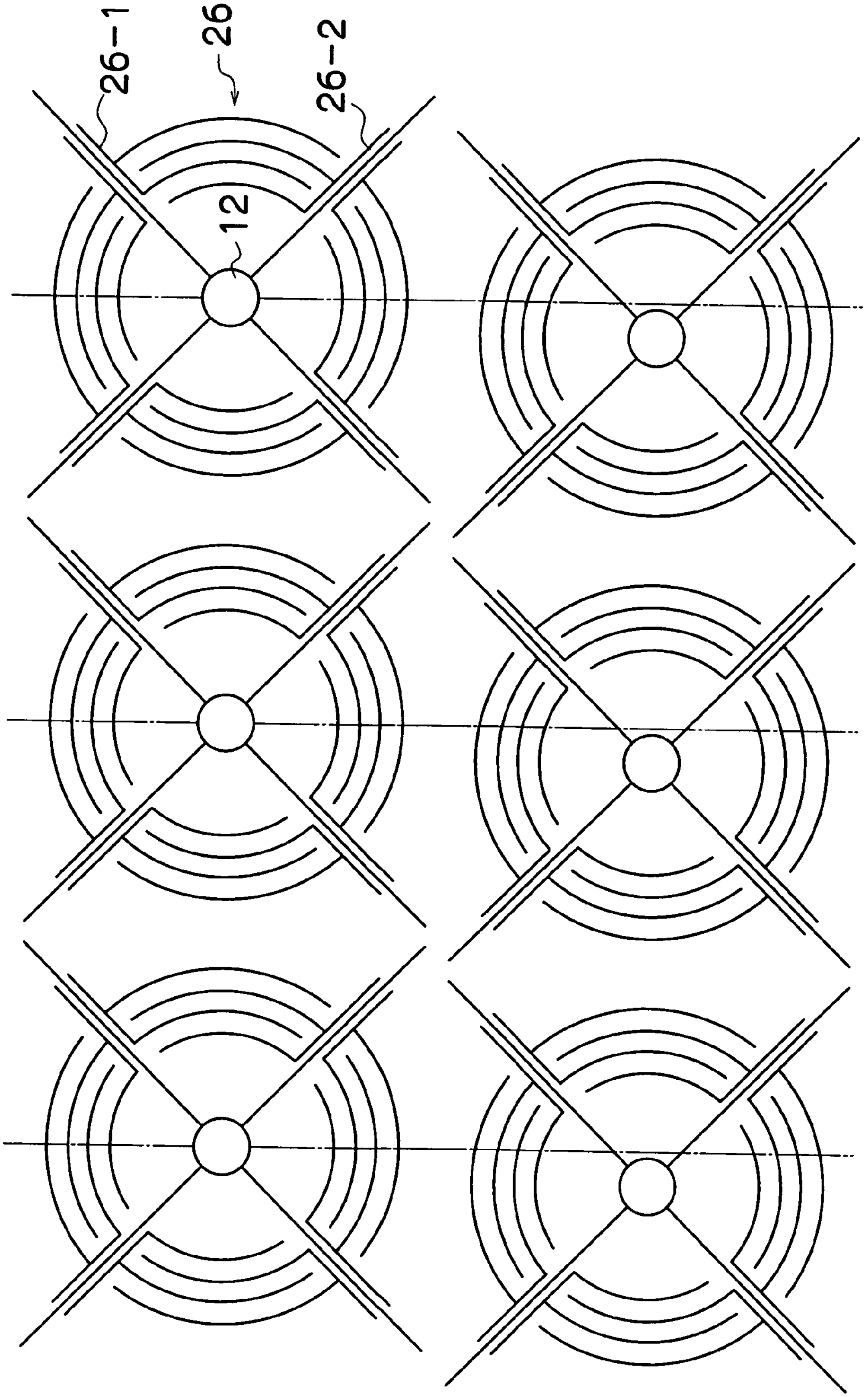
FIG. 8 is a plan diagram illustrating one example of interdigital transducers (IDTs) formed on a surface acoustic wave generating substrate.

As shown in FIG. 8, the comb-shaped interdigital electrodes 26 corresponding to the respective nozzle orifices 12 are disposed on the surface acoustic wave generating substrates 16 so as to correspond to the nozzle arrangement shown in FIG. 7. The mode of the wiring to the comb-shaped interdigital electrodes 26 disposed about the perimeter of the nozzle orifices 12 is not depicted in FIG. 8, but one electrode (for example, the first electrode 26-1) of the comb-shaped interdigital electrodes 26 corresponding to each nozzle orifice 12 is connected to a common ground (GND) line, and the other electrode (the second electrode 26-2) is connected to a data signal line (data line) corresponding to the nozzle position.

Figure 9:
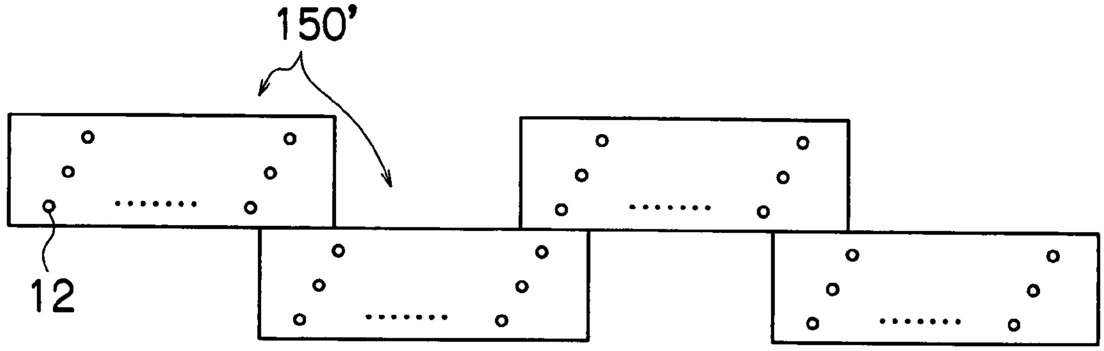
FIG. 9 is a plan diagram illustrating a further example of the composition of a full line head.

In implementing the present invention, the nozzle arrangement structure is not limited to the example shown in FIG. 7. For example, instead of the composition shown in FIG. 7 (a mode where the required nozzle row is constituted by one long head), as one mode of a full line head which has a nozzle row extending through a length corresponding to the full width of the recording paper 116 in a direction substantially perpendicular to the conveyance direction of the recording paper 116, it is possible to compose a line head having a nozzle row of a length corresponding to the full width of the recording paper 116 by joining together, in a staggered matrix arrangement, a plurality of short head blocks 150', each comprising a plurality of nozzle orifices 12 arranged in a two-dimensional configuration, as shown in FIG. 9.

Description of Control System

Figure 10:
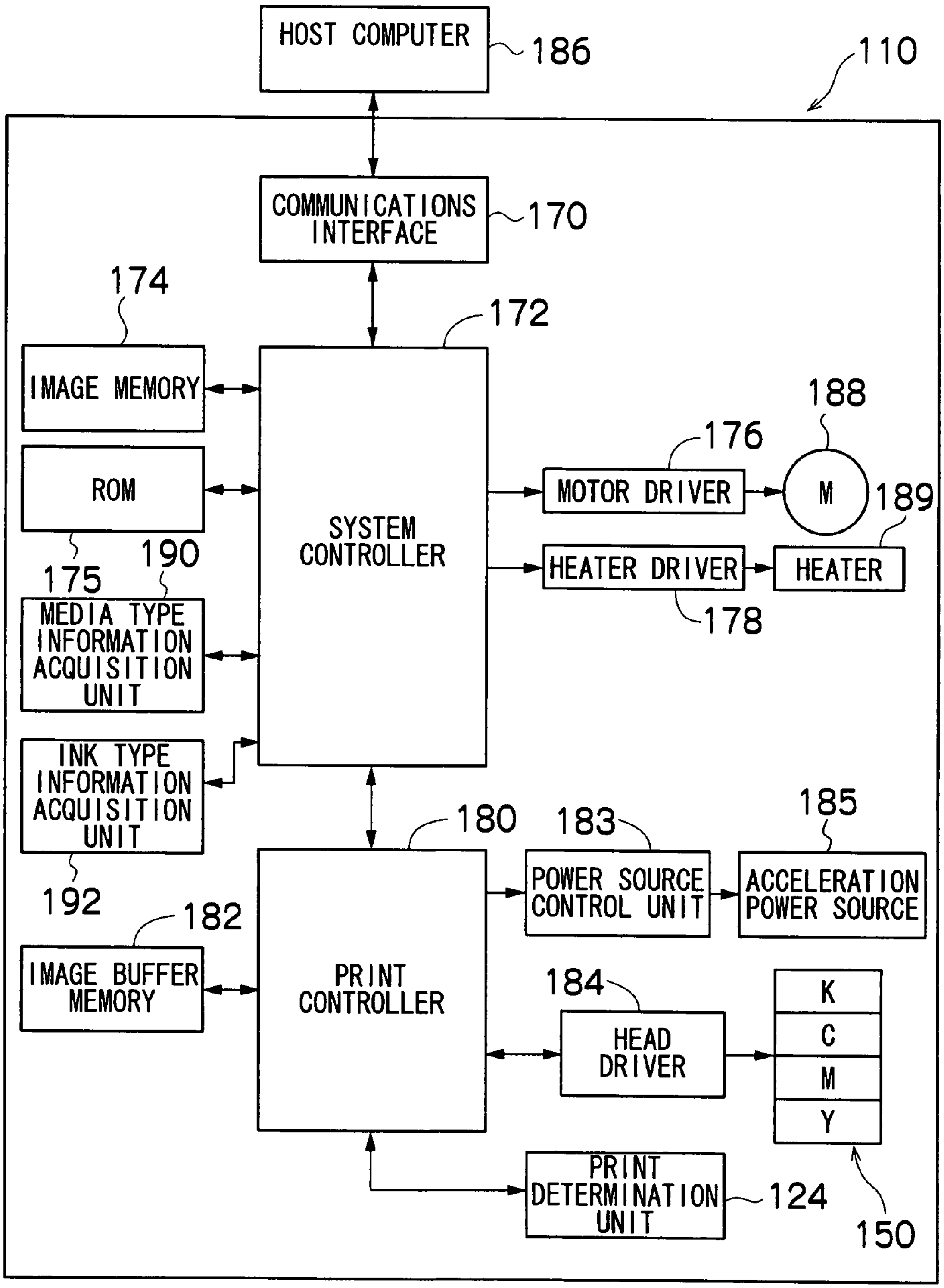
FIG. 10 is a principal block diagram illustrating the system composition of an inkjet recording apparatus according to an embodiment of the present invention.

FIG. 10 is a block diagram illustrating an example of the system composition of the inkjet recording apparatus 110. As shown in FIG. 10, the inkjet recording apparatus 110 comprises a communications interface 170, a system controller 172, an image memory 174, a ROM 175, a motor driver 176, a heater driver 178, a print controller 180, an image buffer memory 182, a power source control unit 183, a head driver 184, an acceleration power source 185 for assisting flight, and the like.

The communication interface 170 is an interface unit (image input device) for receiving image data sent from a host computer 186. A serial interface such as USB (Universal Serial Bus), IEEE1394, Ethernet™, wireless network, or a parallel interface such as a Centronics interface may be used as the communication interface 170. A buffer memory (not shown) may be mounted in this portion in order to increase the communication speed.

The image data sent from the host computer 186 is received by the inkjet recording apparatus 110 through the communication interface 170, and is temporarily stored in the image memory 174. The image memory 174 is a storage device for storing images inputted through the communication interface 170, and data is written and read to and from the image memory 174 through the system controller 172. The image memory 174 is not limited to a memory composed of semiconductor elements, and a hard disk drive or another magnetic medium may be used.

The system controller 172 is constituted by a central processing device (CPU) and peripheral circuits thereof, and the like, and it functions as a control device for controlling the whole of the inkjet recording apparatus 110 in accordance with prescribed programs, as well as a calculation device for performing various calculations. More specifically, the system controller 172 controls the various sections, such as the communications interface 170, image memory 174, motor driver 176, heater driver 178, and the like, and as well as controlling communications with the host computer 186 and writing and reading to and from the image memory 174 and ROM 175. The system controller 172 also generates control signals for controlling the motor 188 of the conveyance system and a heater 189. The motor 188 of the conveyance system is a motor which applies a drive force to the drive rollers of the pairs of conveyance rollers 131 and 133 shown in FIG. 5, for example. Furthermore, the heater 189 in FIG. 10 is a heating device which is used in the heating drum 130, heating fan 140 or post drying unit 142, as shown in FIG. 5.

Programs executed by the CPU of the system controller 172 and various types of data which are required for control procedures are stored in the ROM 175. The ROM 175 may be a non-writeable storage device, or it may be a rewriteable storage device, such as an EEPROM. The image memory 174 is used as a temporary storage region for the image data, and it is also used as a program development region and a calculation work region for the CPU.

The motor driver (drive circuit) 176 drives the motor 188 of the conveyance system in accordance with commands from the system controller 172. The heater driver 178 drives the heater 189 in accordance with commands from the system controller 172.

The print controller 180 functions as a signal processing device which generates dot data for the inks of respective colors on the basis of the input image. More specifically, the print controller 180 is a control unit which performs various treatment processes, corrections, and the like, in accordance with the control implemented by the system controller 172, in order to generate signals for controlling ink droplet ejection, from the image data in the image memory 174, and it supplies the print data (dot data) thus generated to the head driver 184.

The image buffer memory 182 is provided with the print controller 180, and image data, parameters, and other data are temporarily stored in the image buffer memory 182 when the image is processed in the print controller 180. FIG. 10 shows a mode in which the image buffer memory 182 is attached to the print controller 180; however, the image memory 174 may also serve as the image buffer memory 182. Also possible is a mode in which the print controller 180 and the system controller 172 are integrated to form a single processor.

The power source control unit 183 is constituted by a control circuit which controls the on/off switching and the output voltage value of the acceleration power source 185. The power source control unit 183 controls the output of the accelerating power source 185 in accordance with commands from the print controller 180.

To give a general description of the sequence of processing from image input to print output, image data to be printed (original image data) is input from an external source via a communications interface 170, and is stored in the image memory 174. At this stage, RGB image data is stored in the image memory 174, for example.

In this inkjet recording apparatus 110, an image which appears to have continuous tonal graduations to the human eye is formed by changing the droplet ejection density and the dot size of fine dots created by ink (coloring material), and therefore, it is necessary to convert the input digital image into a dot pattern which reproduces the tonal graduations of the image (namely, the light and shade toning of the image) as faithfully as possible. Therefore, original image data (RGB data) stored in the image memory 174 is sent to the print controller 180 through the system controller 172, and is converted to the dot data for each ink color by a half-toning technique, using dithering, error diffusion, or the like, in the print controller 180.

In other words, the print controller 180 performs processing for converting the input RGB image data into dot data for the four colors of K, C, M and Y. The dot data generated by the print controller 180 in this way is stored in the image buffer memory 182.

The head driver 184 outputs drive signals for driving the IDTs 26 corresponding to the respective nozzle orifices 12 of the head 150, on the basis of the ink dot data supplied by the print controller 180 (in other words, the ink dot data stored in the image buffer memory 182). In other words, the print controller 180 and the head driver 184 function in combination as an ejection drive control device. A feedback control system for maintain uniform driving conditions of the head may also be incorporated into the head driver 184.

When a drive signal output from the head driver 184 is supplied to the head 150 thereby generating a capillary wave in the corresponding nozzle orifice 12, then as shown in FIGS. 3A to 3G, an ink droplet is ejected from the nozzle orifice 12. By controlling ink ejection from the head 150 in synchronization with the conveyance speed of the recording paper 116, an image is formed on the recording paper 116.

As described above, the ejection volume and the ejection timing of the liquid droplets from the head 150 are controlled, on the basis of the dot data generated by implementing required signal processing in the print controller 180. By this means, desired dot sizes and dot positions can be achieved.

The print determination unit 124 is a block that includes the image sensor as described above with reference to FIG. 5, reads the image printed on the recording paper 116, determines the print conditions (presence of the ejection, variation in the dot formation, optical density, and the like) by performing required signal processing, or the like, and provides the determination results of the print conditions to the print controller 180. Incidentally, instead of or in conjunction with this print determination unit 124, it is also possible to provide another ejection determination device (corresponding to an ejection abnormality determination device).

The print controller 180 implements various corrections (correction of the ejection volume, correction of the ejection position, and the like), with respect to the print head 150, on the basis of the information obtained from the print determination unit 124 or another ejection determination device (not illustrated), according to requirements, and it implements control for carrying out cleaning operations (nozzle restoring operations), such as preliminary ejection, (which may also be called "purging", "dummy ejection", "blank ejection", or the like), nozzle suctioning, and wiping, as and when necessary.

Furthermore, the inkjet recording apparatus 110 according to the present embodiment comprises a media type information acquisition unit 190 which acquires information relating to the type of recording medium used (media type), and an ink type information acquisition unit 192 which acquires information relating to the type of ink used (ink type information). The information obtained by these units is sent to the system controller 172.

The media type information acquisition unit 190 is a device for determining the type (paper type) and size of the recording medium. This section uses, for example, a device for reading in information such as a bar code attached to the magazine in the paper supply unit 118 illustrated in FIG. 5, or a sensor disposed at a suitable position in the paper conveyance path (a paper width determination sensor, a sensor for determining the thickness of the paper, a sensor for determining the reflectivity of the paper, and so on). A suitable combination of these elements may also be used. Furthermore, it is also possible to adopt a composition in which information relating to the paper type, size, or the like, is specified by means of an input via a prescribed user interface, instead of or in conjunction with such automatic determination devices.

For the device for acquiring information on the ink type, it is possible to use, for example, a device which reads in ink properties information from the shape of the cartridge in the ink tank (a specific shape which allows the ink type to be identified), or from a bar code or IC chip incorporated into the cartridge. Besides this, it is also possible for an operator to input the required information by means of a user interface.

The system controller 172 and the print controller 180 identify the combination of the recording medium and the type of ink, on the basis of the information acquired by the media type information acquisition unit 190 and the ink type information acquisition unit 192, and control the ejection in a suitable fashion with respect to this combination of recording medium and ink by use of the information in the ROM 175.

The embodiment described above relates to a page-wide line head, but the application of the present invention is not limited to a printer based on a line head, and the present invention may also be applied to a printer which performs multi-pass scanning based on a shuttle (serial) scanning method or overlap scanning using a short head.

MODIFICATION EXAMPLE

Figure 11:
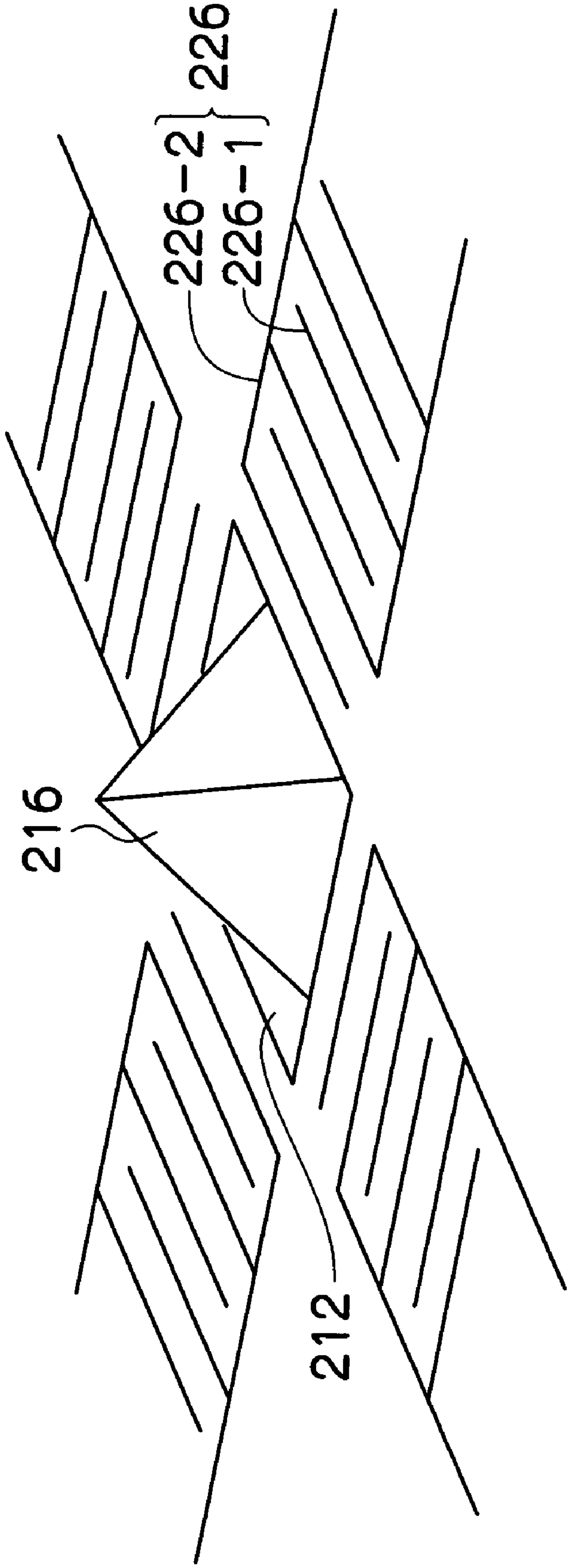
FIG. 11 is a principal oblique diagram illustrating a further embodiment of the present invention.

The embodiment described above relates to a mode where a conically shaped guide member is provided inside the circular nozzle, but the implementation of the present invention is not limited to this mode. For example, as shown in FIG. 11, it is possible to adopt a mode in which a square conical guide (quadrangular pyramid guide) 216 is provided in the center of a square-shaped nozzle orifice 212. In this case, IDTs 226 including comb-shaped electrodes 226-1 and 226-2 are provided so as to correspond with the four edges of the nozzle orifice 212.

The shape of the nozzle orifice and the cone shape (pyramid shape) of the guide member disposed in the center of the nozzle orifice are desirably shapes which have as little anisotropy as possible with respect to the central axis. Taking symmetry into consideration, generally, apart from a circular conical shape, a desirable mode is one in which a regular n-sided conical guide member (where n is an integer equal to or greater than 3) is provided for a regular n-sided nozzle orifice, and the IDTs are disposed so as to correspond with each edge of the nozzle orifice.

The embodiments of the present invention described above relate to an inkjet recording apparatus 110 which forms color images on a recording paper 116 by ejecting liquid ink droplets onto the recording paper 116, but the scope of application of the present invention is not limited to an inkjet recording apparatus. The present invention may also be applied broadly to a liquid ejection apparatus which ejects other types of liquid, such as water, liquid chemicals, treatment liquid, and the like, from nozzle orifices provided in a head.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A liquid ejection head, comprising:

a surface acoustic wave propagation body in which a surface acoustic wave propagates;

a nozzle orifice formed in the surface acoustic wave propagation body;

a surface acoustic wave generation device which is provided on the surface acoustic wave propagation body around the nozzle orifice and excites the surface acoustic wave propagation body so that a surface acoustic wave is generated in the surface acoustic wave propagation body;

a liquid supply device which supplies liquid to the nozzle orifice; and a guide member which is provided in a center of the nozzle orifice and has a tapered conical surface shape section that projects from an ejection surface of the nozzle orifice in an ejection direction, the liquid forming a curved liquid surface in the nozzle orifice in accordance with the tapered conical surface shape section due to surface tension, wherein the surface acoustic wave generates a capillary wave which propagates through the curved liquid surface in the nozzle orifice and which ejects the liquid from an apex section of the tapered conical surface shape section.

2. The liquid ejection head as defined in claim 1, wherein the surface acoustic wave generation device has interdigital transducers.

3. The liquid ejection head as defined in claim 1, wherein the liquid supply device is a liquid reservoir located across the surface acoustic wave propagation body from a surface of the surface acoustic wave propagation body through which the surface acoustic wave propagates.

4. A liquid ejection head, comprising:

a surface acoustic wave propagation body in which a surface acoustic wave propagates;

a nozzle orifice formed in the surface acoustic wave propagation body;

a surface acoustic wave generation device which is provided on the surface acoustic wave propagation body around the nozzle orifice and excites the surface acoustic wave propagation body so that a surface acoustic wave is generated in the surface acoustic wave propagation body;

a liquid supply device which supplies liquid to the nozzle orifice; and a guide member which is provided in a center of the nozzle orifice and has a tapered conical surface shape section that projects from an ejection surface of the nozzle orifice in an ejection direction, the liquid forming a curved liquid surface in the nozzle orifice in accordance with the tapered conical surface shape section due to surface tension, wherein the surface acoustic wave generates a capillary wave which propagates through the curved liquid surface in the nozzle orifice and which ejects the liquid from an apex section of the tapered conical surface shape section, and wherein the surface acoustic wave propagation body has a plurality of polarized cut substrates of piezoelectric material which are provided in form of a mosaic around the nozzle orifice.

5. The liquid ejection head as defined in claim 4, wherein the surface acoustic wave generation device has interdigital transducers each of which has a partial circular arc shape and which are formed on the plurality of polarized cut substrates.

6. The liquid ejection head as defined in claim 1, wherein the guide member is composed of a hydrophilic material.

7. An image forming apparatus comprising the liquid ejection head as defined in claim 1, wherein a droplet of the liquid is ejected from the apex section of the guide member toward a recording medium so that an image is formed on the recording medium.

8. The image forming apparatus comprising the liquid ejection head as defined in claim 1, wherein an electric field is applied to a space across which the ejected liquid is propelled to a speed at which the ejected liquid travels.

9. A liquid ejection head, comprising:

a surface acoustic wave propagation body in which a surface acoustic wave propagates;

a nozzle orifice formed in the surface acoustic wave propagation body;

a surface acoustic wave generation device which is provided on the surface acoustic wave propagation body around the nozzle orifice and excites the surface acoustic wave propagation body so that a surface acoustic wave is generated in the surface acoustic wave propagation body;

a liquid supply device which supplies liquid to the nozzle orifice; and a guide member which is provided in a center of the nozzle orifice and has a tapered conical surface shape section that projects from an ejection surface of the nozzle orifice in an ejection direction, the liquid forming a curved liquid surface in the nozzle orifice in accordance with the tapered conical surface shape section due to surface tension, wherein the surface acoustic wave generates a capillary wave which propagates through the curved liquid surface in the nozzle orifice and which ejects the liquid from an apex section of the tapered conical surface shape section and the apex section includes hydrophobic material.

10. The liquid ejection head as defined in claim 6, wherein the guide member has a surface that has been subjected to a water repellent treatment at only a region of a vicinity of the apex section of the tapered conical surface shape section.

* * * * *